United States Patent [19]

Ikegame et al.

[11] Patent Number: 4,675,720
[45] Date of Patent: Jun. 23, 1987

[54] ENCLOSED THYRISTOR VALVE

[75] Inventors: Hiroo Ikegame, Tokyo; Tadashi Takahashi, Kawasaki, both of Japan

[73] Assignee: Kabushiki Kaisha Toshiba, Kawasaki, Japan

[21] Appl. No.: 767,803

[22] Filed: Aug. 21, 1985

[30] Foreign Application Priority Data

Aug. 23, 1984 [JP] Japan ................... 59-174123

[51] Int. Cl.$^4$ ............................................ H01L 23/16
[52] U.S. Cl. ........................................ 357/75; 557/70;
174/17 GF; 174/17 R; 165/80.1; 165/80.2
[58] Field of Search ............................. 357/74, 75, 82;
174/17 LF, 17 R, 176 F, 18; 361/380-385,
390-391; 165/80.1-80.5

[56] References Cited

U.S. PATENT DOCUMENTS 1,453,083  4/1923  Schuler .................... 174/17 GF
2,777,009  1/1957  Whitman .................. 174/17 GF

OTHER PUBLICATIONS

"Development of HDVC Thyristor Valve Insulated and Cooled by Compressed SF$_6$ Gas", IEEE Transactions on Power Apparatus and Systems, vol. PAS-102, No. 9, Sep. 1981, pp. 3243-3253.

Primary Examiner—James W. Davie
Assistant Examiner—Georgia Y. Epps
Attorney, Agent, or Firm—Schwartz, Jeffery, Schwaab, Mack, Blumenthal & Evans

[57] ABSTRACT

An enclosed thyristor valve of the type dividable into first and second portions comprises a tank, a thyristor valve assembly including a plurality of thyristor elements encased in the tank, a plurality of light guides extending through the tank for transmitting light signals for firing the thyristor elements, cooling pipes extending through the tank for circulating a coolant to cool the thyristor assembly, and bushings mounted on the tank for connecting the thyristor valve assembly with a power line system. The first and second portions are connected at mating flange portions disposed to the first and second portions of the tank. The light guides and cooling pipes are provided for the first portion of the tank so that the light guides and the cooling pipes are not disconnected from the first portion when the inspection and the maintenance of the thyristor valve are required.

7 Claims, 7 Drawing Figures

ENCLOSED THYRISTOR VALVE

BACKGROUND OF THE INVENTION

This invention relates to a thyristor valve adapted to be used in a power line system such as a high voltage DC power transmission system and an AC power system interconnecting power lines of different frequencies, and more particularly to an enclosed thyristor valve whose maintenance and inspection are substantially simplified.

According to a remarkable progress in recent years in the field of semiconductor technology, there has been developed a thyristor element which is operable at high voltage and heavy current and which is directly fired by a light signal. Thyristor valves or thyristor switching devices utilizing the aforementioned thyristor elements have also been developed and the capacities thereof have been increased constantly. According to the increase in voltage and current, a cooling device for the thyristor valves which is simple in construction and of a high efficiency is urgently required.

In order to satisfy such requirement, an enclosed type construction wherein the thyristor elements and others are enclosed in a tank filled with an insulating gas such as $SF_6$ gas and cooled by a coolant such as oil, water, flon and the like has been heretofore proposed.

Although a thyristor valve of the above described construction is found to be operable satisfactorily, the inspection and maintenance thereof become extremely difficult. Ordinarily, a thyristor valve contains tens of thousands of parts, some of which must be replaced periodically during several years of usage. When the parts are replaced or when the thyristor valve has a trouble, the parts must be pulled out of the tank for the purpose of inspection and maintenance, and the fact how the time and labor required for the inspection and maintenance can be reduced constitutes a problem which must be solved urgently.

SUMMARY OF THE INVENTION

An object of this invention is to provide an enclosed type thyristor valve, wherein the above described difficulties of the conventional construction can be substantially eliminated.

Another object of this invention is to provide an enclosed type thyristor valve, wherein the removal of the casing or pulling the internal components of the thyristor valve out of the casing can be simplified and the inspection and maintenance of the same can be facilitated.

According to the present invention, there is provided an enclosed type thyristor valve comprising a tank, a thyristor valve assembly including a plurality of thyristor elements encased in the tank, a plurality of light guides extended through the tank for supplying light signals for firing the thyristor elements, cooling pipes also extended through the tank for circulating a coolant through the thyristor elements, and a pair of bushings provided through the tank for connecting the thyristor valve assembly with a power line system, characterized in that the tank is divided into a first portion and a second portion detachably connected together by means of flanges, the thyristor valve assembly is secured internally of the first portion of the tank, and coupling means one for coupling the cooling pipes and the other for coupling the light guides are provided through the first portion of the tank for facilitating separation of the first and second portions and hence facilitating inspection and maintenance of the thyristor valve. The characteristic features of this invention can be applied to a horizontally located tank as well as a vertically located tank.

DESCRIPTION OF THE PREFERRED EMBODIMENTS

Before entering the description of the invention, a conventional construction of an enclosed type thyristor valve will be described with reference to FIGS. 1, 2 and 3.

Figure 1:
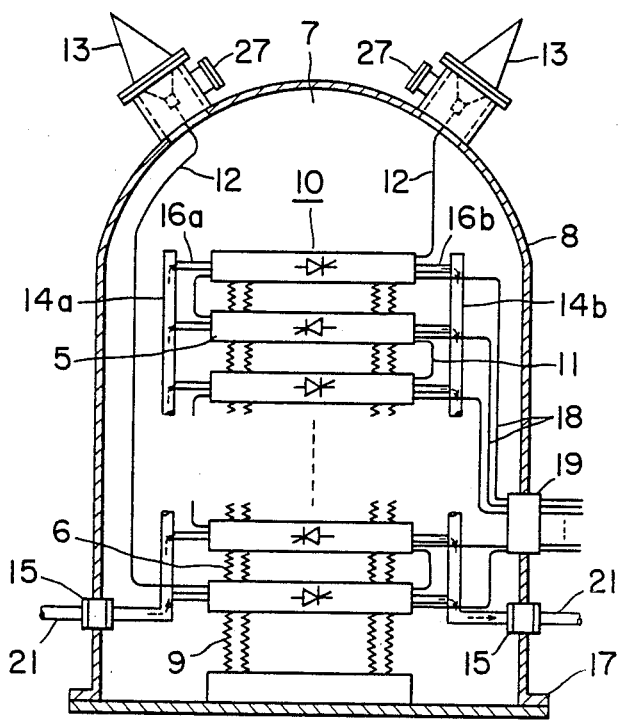
FIG. 1 is a diagram showing, in elevation, a conventional enclosed type thyristor valve.

The conventional construction of the thyristor valve shown in FIG. 1 comprises a casing or tank 8 filled with an insulating gas such as $SF_6$ and a valve assembly 10 encased in the tank 8. The valve assembly 10 comprises a plurality of thyristor modules 5 arranged in a plurality of stages. As shown in FIG. 2, each of the thyristor modules comprises a plurality of thyristor elements 1 and anode and cathode reactors 2 connected in series. A voltage dividing circuit comprising capacitors 3 and resistors 4 is connected in parallel with the thyristor elements 1.

Returning to FIG. 1, the enclosed type thyristor valve further comprises insulators 6 which separate the thyristor modules from each other, and insulators 9 which support the whole thyristor valve assembly 10 in a spaced apart relation from the tank 8. Conductors 11 are further provided to connect the thyristor modules 5 in series. Main circuit conductors 12 connect both ends of the series connected thyristor modules 5 with bushings 13 secured to the tank 8.

On both sides of the valve assembly 10 are provided a main coolant supplying pipe 14a and a main coolant delivering pipe 14b both made of an insulating material. A plurality of branch pipes 16a and 6b are extended from the main coolant supplying and coolant delivering pipes 14a and 14b to be connected with the inlet and exhaust side ends of the thyristor modules, respectively. A coolant consisting of, for instance, oil, water, flon and the like is supplied into the main coolant supplying pipe 14a, passed through the thyristor modules 5 in an arrow-marked direction, and delivered from the main coolant delivering pipe 14b to outside. Couplings 15 of a gas-tight construction are provided through the tank 8 for connecting the two main pipes 14a and 14b therethrough with outside cooling pipes 21, respectively.

In a thyristor valve of, for instance, 250 KV and 3000 A, there are provided approximately 200 thyristor elements 1. Light guides 18 are provided for transmitting light signals to the thyristor elements 1 for firing the same and for detecting conditions of the thyristor elements 1. An optical connector 19 of a gas-tight construction is provided through the tank 8 for interconnecting the light guides 8 provided internally and externally of the tank 8.

Outside of the tank 8 is provided a pulse generator, not shown, which generates light signals for firing the thyristor elements 1. The light signals generated in the pulse generator is transmitted through the light guides 18 and the optical connector 19 to the thyristor elements 1 encased in the tank 8. The optical connector 19 includes a number of glass rods 20 which can transmit the light signals with a minimum amount of transmission loss.

The thyristor valve of the above described conventional construction, however, has revealed a difficulty, in which when it is desired to pull out the valve assembly 10 out of the tank 8 or to expose the same to the atmosphere for the purpose of inspection and maintenance, the couplings 15 for coupling the cooling pipes, the optical connector 19 for interconnecting the light guides 18, and the main circuit conductors 12 which connect the two ends of the valve assembly 10 with the bushings 13, must be disconnected at least internally of the tank 8. Such disconnecting workings include very difficult and troublesome operations and in a worst case where the essential part of the tank 8 is to be removed, cooling pipes 21 and light guides 18 provided outside of the tank 8 must be further disconnected from the couplings 15 and the connector 19, respectively. The disconnection of the light guides 18 from the optical connector 19 and the disconnection of the main cooling pipes 14a and 14b from the couplings 15 internally of the tank 8 are extremely difficult and troublesome because of a narrow space available in the tank 8, and hence a comparatively long time has been required for the inspection and maintenance of the thyristor valve. Particularly, the disconnection of the light guides 18 from the optical connector 19 usually requires the removal of a number of screw means internally of the tank 8. Such a feature has entailed a long interruption of the power line system utilizing the thyristor valve and the reliability of the same is thereby reduced.

According to this invention, there is provided an enclosed type thyristor valve wherein the inspection and maintenance of the valve assembly can be carried out without requiring the disconnection of the light guides and cooling pipes out of the optical connector and the pipe couplings.

Figure 2:
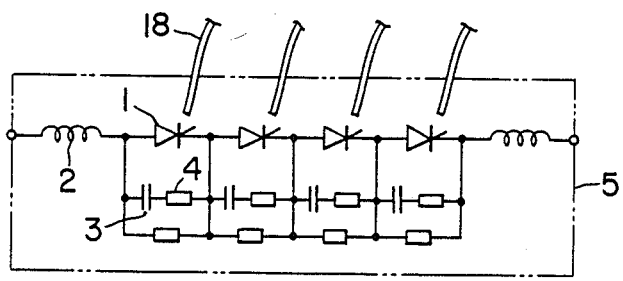
FIG. 2 is a circuit diagram showing a thyristor module used in the thyristor valve shown in FIG. 1.
Figure 3:
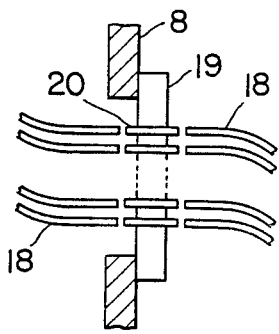
FIG. 3 is a diagram showing a detailed construction of a connector to be used for light guides shown in FIG. 1.
Figure 4:
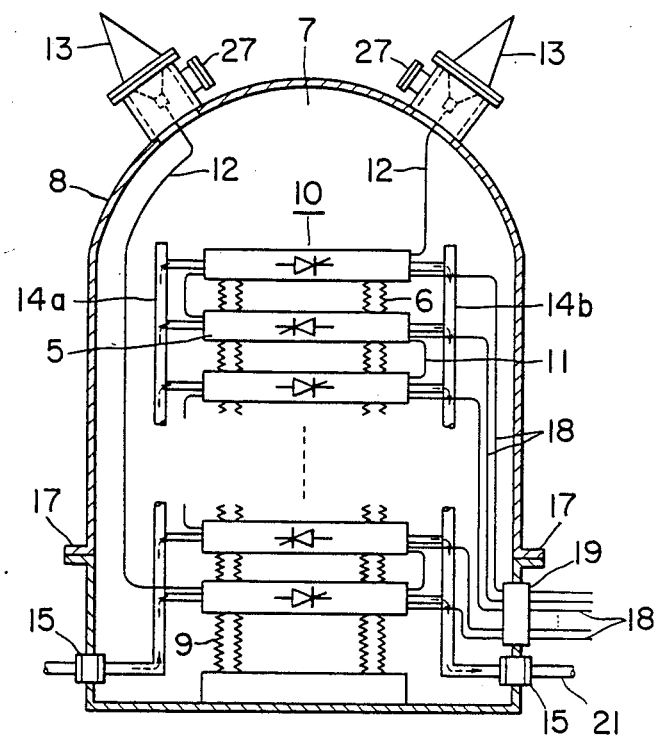
FIG. 4 is a diagram showing, in elevation, an enclosed type thyristor valve constituting a preferred embodiment of this invention.

FIG. 4 illustrates a preferred embodiment of the invention in which like reference numerals are added to elements corresponding to those shown in FIGS. 1 to 3.

In this embodiment, there is provided a tank 8 which is divided into an upper portion and a lower portion. The dividing position is so selected that when the upper portion of the tank 8 is removed, most part of the components contained in the tank 8 is exposed to outside. Flanges 17 are provided in the mating parts of the two portions, and combined together by means of, for instance, bolts and nuts thereby providing the tank 8.

A valve assembly 10 of a construction similar to that shown in FIG. 1 is encased in the tank 8 of the above described construction, and an insulating gas such as $SF_6$ is filled in the tank 8. Main cooling pipes 14a and 14b are also provided in the tank 8 on both sides of the valve assembly 10. A plurality of branch pipes 16a and 16b are also provided to connect the inlet and outlet sides of the thyristor modules 5 of the assembly 10 to the main cooling pipes 14a and 4b, respectively. A coolant of, for instance, oil, water, flon and the like is supplied from outside of the tank 8 into the main pipe 14a and circulated through the thyristor modules 5 in an arrow-marked direction. A great number of light guides 18 are also provided for transmitting light signals generated in a pulse generator, not shown, to the thyristor elements 1.

According to the embodiment shown in FIG. 4, couplings 15 through which the main cooling pipes 14a and 14b are connected with outside pipes 21 and an optical connector 19 through which the light guides provided internally and externally of the tank 8 are connected together, are both provided through the wall of the lower portion of the tank 8. The couplings 15 and the optical connector 19 are made into a gas-tight construction as in the case of the conventional thyristor valve shown in FIG. 1.

At the time of the inspection and maintenance, the insulating gas is exhausted and the flanges 17 are detached from each other. The main circuit conductors 12 connecting the two ends of the thyristor assembly 10 with the bushings 13 are then disconnected by, for instance, inserting a hand through hand holes 27 provided on the tank 8 near the bushings 13, and the upper portion of the tank 8, which covers the substantially entire part of the valve assembly 10, is thereby removed out of and separated from the lower portion thereof. In this embodiment, since the couplings 15 and the optical connector 19 are provided through the lower portion of the tank 8, the disconnection of these couplings 15 and connector 19 is not required, and hence the inspection and maintenance of the embodiment are extremely simplified without troublesome disassembling works.

Figure 5:
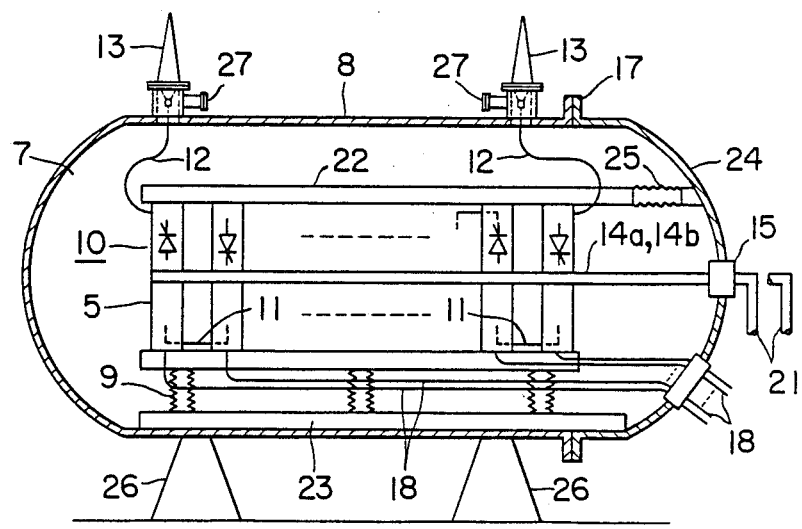
FIG. 5 is a diagram showing, in elevation, another embodiment of this invention.

FIG. 5 illustrates another embodiment of this invention wherein the tank 8 and the valve assembly 10 are disposed horizontally. According to this embodiment, the tank 8 is divided into a right portion and a left portion with flanges 17 provided at the mating ends of the two portions in a similar manner to that described with reference to the first embodiment shown in FIG. 4. The upper and lower ends of each thyristor module 5 are secured to horizontally extending insulating bars 22 made of, for instance, FRP (fiber reinforced plastics) and the like. The entire thyristor valve assembly 10 comprising the thyristor modules 5 is supported on a base 23 with insulators 9 interposed between the valve assembly 10 and the base 23. The right ends of the base 23 and the insulating bars 22 are secured to the right portion 24 of the tank 8. An insulator 25 is interposed between the upper bar 22 and the tank wall of the right portion 24 of the tank 8. The lower side of the base 23 is slidingly supported on the bottom wall of the left portion of the tank 8. Main cooling pipes 14a and 14b are provided to extend horizontally, and the rightward ends of the main pipes 14a and 14b are connected through couplings 15 to outside cooling pipes 21, respectively, for circulating a coolant such as oil, water, flon and the like through the thyristor modules 5. Light guides 18 are also provided internally and externally of the tank 8 for transmitting light signals from outside to thyristor elements provided in the thyristor modules for controlling the same. An optical connector 19 is provided through the tank wall of the right portion 24 of the tank 8 for interconnecting the light guides 18 provided internally and externally of the tank 8 by means of a number of screws, for example. The left portion of the tank 8 which covers the most part of the valve assembly 10 is supported by tank supporting members 26 of a suitable construction.

In case of the inspection and maintenance of the embodiment, the thyristor valve assembly 10 is pulled out of the tank 8 by firstly exhausting the insulating gas filling the inside thereof and disassembling the tank 8 into the right and left portions. Then the main circuit conductors 12 are disconnected by the manner as described in the case of the embodiment shown in FIG. 4. When it is required to disassemble the tank 8, the light guides 18 and cooling pipes 21 provided outside of the tank 8 are disconnected from the optical connector 19 and the couplings 15, respectively, by loosening and removing screw means, for example only externally of the tank 8. Then the thyristor valve assembly 10 is pulled out of the left portion of the tank 8 together with the right portion of the same without requiring the internal disconnection, i.e., removal of the screw means internally of the tank, of the light guides 18 and the main cooling pipes 14a and 14b from the corresponding connector 19 and couplings 15, respectively. Moreover, in a case where the flexible light guides 18 and the cooling pipes 21 each have a suitable length externally of the tank 8, there is no need for removing the screw means connecting these members.

Figure 6:
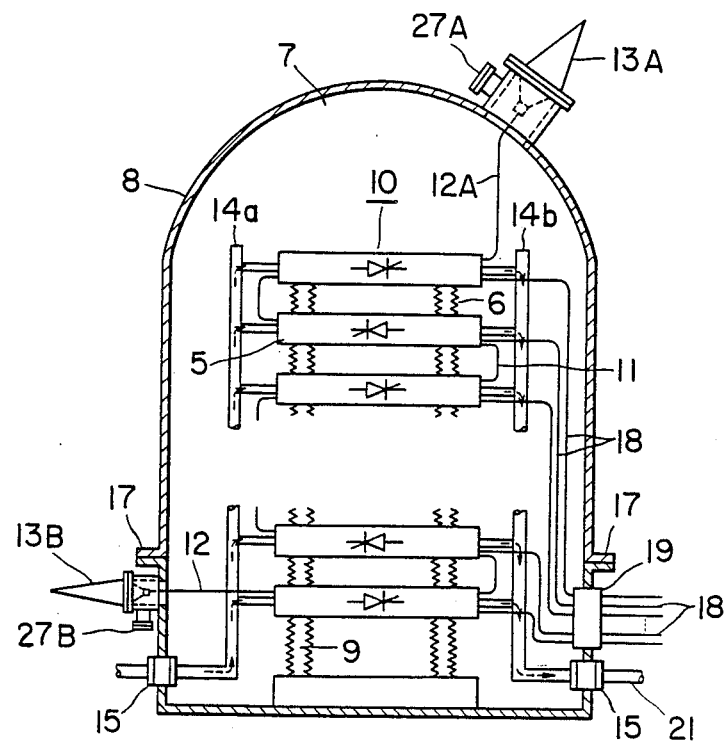
FIG. 6 is a diagram showing a modification of the embodiment shown in FIG. 4.
Figure 7:
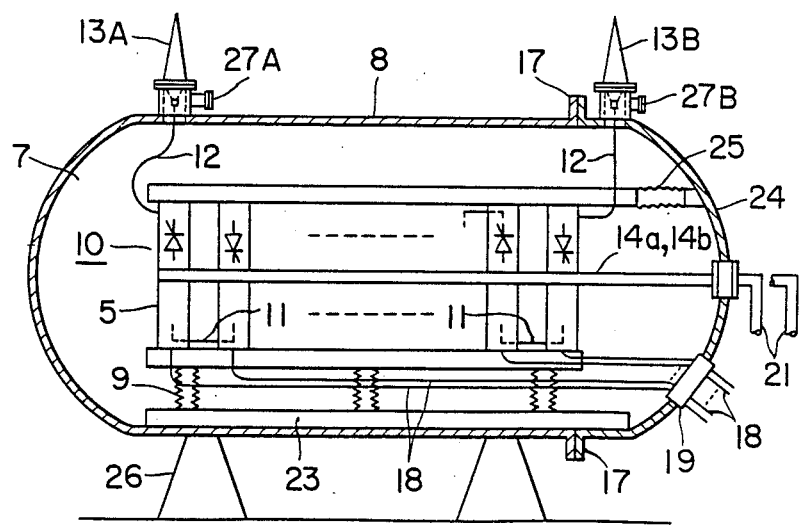
FIG. 7 is a diagram showing a modification of the embodiment shown in FIG. 5.

FIGS. 6 and 7 illustrate modified constructions of the embodiments shown in FIGS. 4 and 5, respectively. In either one of the modifications, bushings 13A and 13B are provided for connecting the high-voltage (i.e. cathode) side and the low-voltage (i.e. anode) side of the thyristor valve assembly 10 to the corresponding terminals of the power line system. In the modification shown in FIG. 6, the low-voltage side bushing 13B is provided on the lower portion of the tank 8, while in the modification shown in FIG. 7, the low-voltage side bushing 13B is provided on the right portion of the tank 8.

With the low-voltage side bushing 13B thus provided on one portion of tank 8 on which the valve assembly 10 is mounted, the necessity of disconnecting the main circuit conductor 12 out of the low-voltage side bushing 13B can be obviated beside of the above described advantageous features of the embodiments shown in FIGS. 4 and 5.

Although in the above described modifications, the low-voltage side bushing 13B has been provided on one portion of the tank 8 on which the thyristor valve assembly 10 is mounted, both of the high-voltage side and low-voltage side bushings 13A and 13B may be provided on the portion of the tank 8, on which the thyristor valve assembly 10 is mounted, and by so constructing, the necessity of disconnecting the conductors 12 from these bushings 13A and 13B at the time of the inspection and maintenance can be utterly eliminated.

What is claimed is:

1. In an enclosed type thyristor valve comprising a tank, a thyristor valve assembly including a plurality of thyristor elements encased in said tank, a plurality of light guides extending through said tank for transmitting light signals for firing said thyristor elements, cooling pipes extending through said tank for circulating a coolant through said thyristor elements, and a pair of bushings provided through said tank for connecting said thyristor valve assembly with a power line system, the improvement wherein said tank is divided into a first portion and a second portion detachably connected together by means of flanges, said thyristor valve assembly is secured internally of said first portion of said tank, coupling means one for coupling said cooling pipes and the other for coupling said light guides are provided through said first portion of said tank and said flanges are provided at a position so selected that when at least said second portion of said tank is removed said thyristor valve assembly is substantially exposed for facilitating inspection and maintenance of said thyristor elements.

2. An enclosed type thyristor valve according to claim 1 wherein said tank is located vertically and said first portion of said tank constitutes a lower half thereof and said second portion of said tank constitutes an upper half thereof, and at the time of imspection and maintenance of the thyristor valve assembly, said flange means are disengaged and said bushings are disconnected from the thyristor valve assembly, whereby said second portion of the tank is separated upwardly from said first portion of the tank.

3. An enclosed type thyristor valve according to claim 1 wherein said tank is located horizontally so that said first portion and second portion of the tank are arranged horizontally and said second portion of the tank is held stationarily, while said first portion of the tank is separated out of said second portion together with said thyristor valve assembly said light guides and said cooling pipes by horizontally sliding said first portion of said tank.

4. An enclosed type thyristor valve according to claim 2 wherein at least one of said bushings connected to one terminal of said thyristor valve assembly is provided through said first portion of said tank, while the other one of said bushings connected to the other terminal of said assembly is provided through said second portion of said tank.

5. An enclosed type thyristor valve according to claim 3 wherein at least one of said bushings connected to one terminal of said thyristor valve assembly is provided through said first portion of said tank while the other one of said bushings connected to the other terminal of said thyristor valve assembly is provided through said second portion of said tank.

6. An enclosed type thyristor valve according to claim 5 wherein light guides and cooling pipes are constructed by flexible members each having a predetermined length externally of said tank.

7. An enclosed type thyristor valve according to claim 1 wherein said flanges are provided at a position so selected that after the separation of said two portions of the tank, substantially entire part of said thyristor valve assembly is exposed to outside.

* * * * *